United States Patent
Sakurai et al.

(10) Patent No.: US 11,519,938 B2
(45) Date of Patent: Dec. 6, 2022

(54) PROBE HEAD

(71) Applicant: YOKOWO CO., LTD., Tokyo (JP)

(72) Inventors: Yoshihiko Sakurai, Tomioka (JP); Hiroshi Ishigure, Tomioka (JP); Daisuke Hosokawa, Tomioka (JP)

(73) Assignee: YOKOWO CO., LTD., Tokyo (JP)

( * ) Notice: Subject to any disclaimer, the term of this patent is extended or adjusted under 35 U.S.C. 154(b) by 0 days.

(21) Appl. No.: 16/764,599

(22) PCT Filed: Nov. 6, 2018

(86) PCT No.: PCT/JP2018/041083
§ 371 (c)(1),
(2) Date: May 15, 2020

(87) PCT Pub. No.: WO2018/098079
PCT Pub. Date: May 23, 2019

(65) Prior Publication Data
US 2020/0393496 A1     Dec. 17, 2020

(30) Foreign Application Priority Data

Nov. 16, 2017  (JP) .............................. JP2017-221180

(51) Int. Cl.
*G01R 1/073*     (2006.01)
(52) U.S. Cl.
CPC ................. *G01R 1/07314* (2013.01)
(58) Field of Classification Search
CPC ................................................ G01R 1/07314
See application file for complete search history.

(56) References Cited

U.S. PATENT DOCUMENTS

| 2004/0095157 A1* | 5/2004 | Sato | G01R 1/07371 |
| | | | 324/756.01 |
| 2006/0066331 A1* | 3/2006 | Yoshida | G01R 1/06772 |
| | | | 324/756.03 |

(Continued)

FOREIGN PATENT DOCUMENTS

| EP | 0180013 A1 | 5/1986 |
| EP | 2017629 A1 | 1/2009 |

(Continued)

OTHER PUBLICATIONS

English translation EP 0180013 B1 (Year: 1990).*

(Continued)

*Primary Examiner* — Paresh Patel
(74) *Attorney, Agent, or Firm* — Xsensus LLP

(57) ABSTRACT

Provided is a probe head capable of reducing an inductance value of a ground probe. In a probe head 1, a pin plate 40, a pin block 50, and a solder resist film 60 are stacked in this order from a measuring instrument side to be integrally formed, and constitute a support body that supports a signal probe 10 and a first ground probe 20. The pin plate 40 is an insulator. The pin block 50 is a conductor, and is electrically connected to the first ground probe 20 and a measuring instrument-side ground, and is not electrically connected to the signal probe 10. The solder resist film 60 is provided on the surface of the pin block 50 on a side of a device to be inspected, and is interposed between the pin block 50 and the device to be inspected.

20 Claims, 3 Drawing Sheets

(56) References Cited

U.S. PATENT DOCUMENTS

| | | | | |
|---|---|---|---|---|
| 2007/0145990 A1* | 6/2007 | Fukushima | ............ | G01R 1/045 |
| | | | | 324/755.05 |
| 2009/0085593 A1* | 4/2009 | Yoshida | ............ | G01R 1/06772 |
| | | | | 324/754.1 |
| 2009/0311890 A1* | 12/2009 | Nakayama | ......... | G01R 1/07371 |
| | | | | 439/91 |
| 2010/0244872 A1 | 9/2010 | Yoshida et al. | | |

FOREIGN PATENT DOCUMENTS

| | | | |
|---|---|---|---|
| JP | 61-80067 A | | 4/1986 |
| JP | H03-205843 A | | 9/1991 |
| JP | 2005049163 A | * | 2/2005 |
| JP | 2005-241505 A | | 9/2005 |
| JP | 2007-178165 A | | 7/2007 |
| JP | 2009-043640 A | | 2/2009 |
| JP | 2013-134982 A | | 7/2013 |
| WO | 2007/125974 A1 | | 11/2007 |

OTHER PUBLICATIONS

English Translation JP 2005-241505 A (Year: 2005).*
English translation of JP2005049163A (Year: 2005).*
International Search Report and Written Opinion dated Jan. 29, 2019 for PCT/JP2018/041083 filed on Nov. 6, 2018, 9 pages including English Translation of the International Search Report.
Supplementary European search report dated Jul. 14, 2021, in corresponding European patent Application No. 18878712.1, 3 pages.

* cited by examiner

SIDE OF DEVICE TO BE INSPECTED

MEASURING INSTRUMENT SIDE

1 PROBE HEAD

SIDE OF DEVICE TO BE INSPECTED

MEASURING INSTRUMENT SIDE

2 PROBE HEAD

PROBE HEAD

CROSS-REFERENCE TO RELATED APPLICATIONS

The present application is based on PCT filing PCT/JP2018/041083, filed Nov. 6, 2018, which claims priority to JP 2017-221180, filed Nov. 16, 2017, the entire contents of each are incorporated herein by reference.

TECHNICAL FIELD

The present invention relates to a probe head used for electrical inspection of an IC formed on a wafer, for example.

BACKGROUND ART

In general, a probe head includes a signal probe, a ground probe, and a pin block and a pin plate that support each probe.

CITATION LIST

Patent Literature

Patent Literature 1: Japanese Unexamined Patent Application Publication No, 2013-134982

SUMMARY OF INVENTION

Problem to be Solved by Invention

In the conventional probe head disclosed in Patent Literature 1, the pin block is made of resin, and thus, there is a problem in that the inductance value of the ground probe is high and the signal transmission characteristics are poor.

The present invention has been made in view of these circumstances, and an object, thereof is to provide a probe head capable of reducing the inductance value of a ground probe.

Means for Solving Problem

An aspect of the present invention is a probe head. The probe head includes a signal probe, a first ground probe, and a pin block through which the signal probe and the first ground probe penetrate. In the probe head, at least a part of the pin block is electrically conductive, and the pin block is electrically connected to the first ground probe and is not electrically connected to the signal probe, and an insulation layer is provided on a surface of the pin block on a side of a device to be inspected.

The insulation layer may be a sheet or a film.

The insulation layer may be an insulating material applied to the surface of the pin block.

The insulation layer may be fixed to the pin block.

The pin block may be made of metal.

The pin block may be an insulator with a metal-coated surface.

The probe head may include a second ground probe that electrically connects the pin block to a measuring instrument-side ground.

The length of the second ground probe may be shorter than the length of the first ground probe, the diameter of the second ground probe may be larger than the diameter of the first ground probe, and the second ground probe may be in contact with a surface of the pin block on a measuring instrument side to be electrically connected to the pin block.

It is noted that any combination of the above-described constituent components and any conversion of the expressions of the present invention, such as a conversion between the expressions method and system, are also effective as aspects of the present invention.

Effect of Invention

According to the present invention, a probe head capable of reducing the inductance value of a ground probe can be provided.

DESCRIPTION OF EMBODIMENTS

Figure 1:
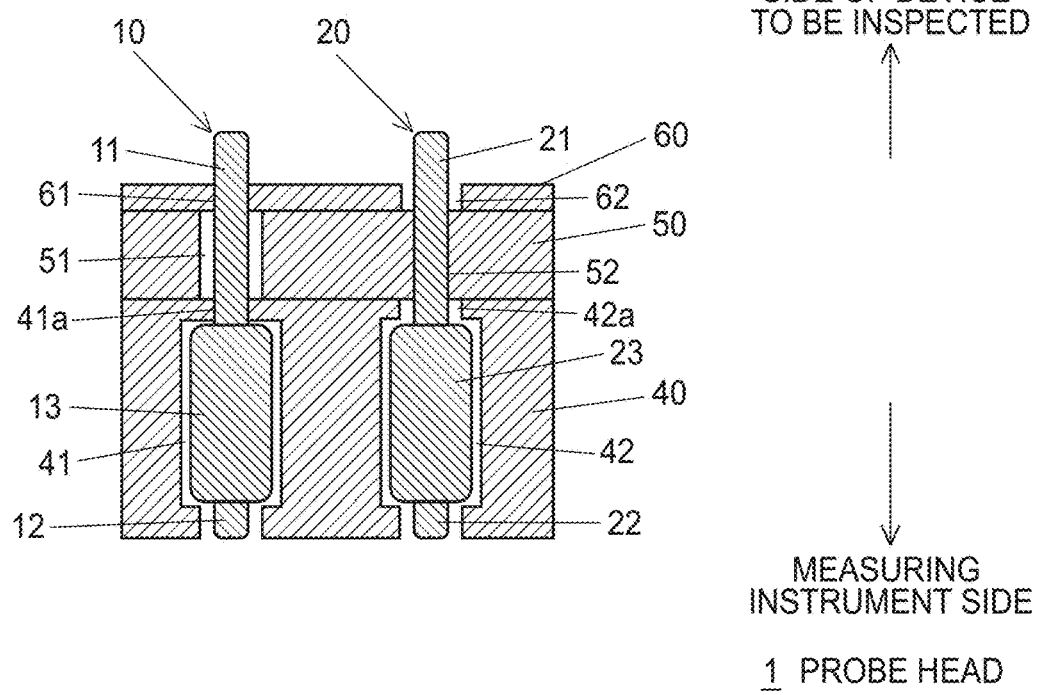
FIG. 1 is a schematic cross-sectional view of a probe head 1 according to a first embodiment of the present invention.

Below, preferred embodiments of the present invention will be described in detail with reference to the drawings. The same or equivalent constituent components, members, and the like illustrated in the drawings are denoted by the same reference numerals, and repeated description thereof will be omitted as appropriate. Further, the embodiments are exemplifications that do not limit the invention, and all features described in the embodiments and combinations thereof may not necessarily be essential to the invention.

First Embodiment

FIG. 1 is a schematic cross-sectional view of a probe head 1 according to a first embodiment of the present invention. The probe head 1 includes a signal probe 10, a first ground probe 20, a pin plate 40, a pin block 50, and a solder resist film 60.

The signal probe 10 is a probe for transmitting a signal between an inspection substrate (not illustrated) on a measuring instrument side and a device to be inspected (not illustrated). The first ground probe 20 is a probe for electrically connecting a ground of the inspection substrate (measuring instrument-side ground) and a ground of the device to be inspected (ground on the side of the device to be inspected) with each other. A known probe (for example, a spring probe) made of a metal such as copper or a copper alloy can be used as the signal probe 10 and the first ground probe 20.

The signal probe 10 includes a first plunger 11, a second plunger 12, and a conductive tube 13. Base ends of the first plunger 11 and the second plunger 12 are accommodated in the conductive tube 13. In the conductive tube 13, a spring (for example, a coil spring) (not illustrated) is provided that urges the first plunger 11 and the second plunger 12 in a direction away from each other to apply a contact force on the first plunger 11 and the second plunger 12 with respect to the device to be inspected and the inspection substrate, Here, the first ground probe 20 has the same configuration as the signal probe 10, and includes a first plunger 21, a second plunger 22, and a conductive tube 23. The conductive tube 23 is provided with a spring (for example, a coil spring) (not illustrated). The spring urges the first plunger 21 and the second plunger 22 in a direction away from each other to apply a contact force on the first plunger 21 and the second plunger 22 with respect to the device to be inspected and the inspection substrate. It is noted that the signal probe 10 and the first ground probe 20 may each have different configurations.

The pin plate 40, the pin block 50, and the solder resist film 60 are stacked in this order from the measuring instrument side to be integrally formed, and constitute a support body that supports the signal probe 10 and the first ground probe 20. The pin plate 40 is an insulator (insulating layer), such as ceramic. The pin plate 40 constitutes a layer of the support body closest to the measuring instrument side. The pin plate 40 may be divided into a plurality of layers. The pin block 50 is a conductor (conductive layer), such as gold-plated brass. The pin block 50 is provided on the surface of the pin plate 40 on the side of the device to be inspected. The pin block 50 is electrically connected to the measuring instrument-side ground by a conduction part (not illustrated), The inductance value of the conduction part (inductance value between the pin block 50 and the measuring instrument-side ground) is lower than the inductance value of a portion of the first ground probe 20 from a tip end of the second plunger 22 to a contact part between the first plunger 21 and the pin block 50. The solder resist film 60 is an example of an insulation layer, and is provided on the surface of the pin block 50 on the side of the device to be inspected. The solder resist film 60 may be fixed to the surface of the pin block 50 on the side of the device to be inspected. The solder resist film 60 constitutes a layer of the support body closest to the side of the device to be inspected, and is interposed between the pin block 50 and the device to be inspected.

The signal probe 10 is inserted to pass through a through hole 41 of the pin plate 40, a through hole 51 of the pin block 50, and a through hole 61 of the solder resist film 60 that communicate with each other. The signal probe 10 is inserted into and supported by the through hole 41, the through hole 51, and the through hole 61. Similarly the first ground probe 20 is inserted to pass through a through hole 42 of the pin plate 40, a through hole 52 of the pin block 50, and a through hole 62 of the solder resist film 60 that communicate with each other. The first ground probe 20 is inserted into and supported by the through hole 42, the through hole 52, and the through hole 62. The through holes 41 and 42 of the pin plate 40 are stepped holes each, so that each of the conductive tube 13 and the conductive tube 23 does not detach from the pin plate 40.

The inner dimension (inner diameter) of the through hole 51 of the pin block 50 is larger than the inner dimension (inner diameter) of a narrowed part 41a of the pin plate 40 on the side of the pin block 50 and the inner dimension (inner diameter) of the through hole 61 of the solder resist film 60. Thus, the first plunger 11 of the signal probe 10 is supported by the pin plate 40 and the solder resist film 60, and an outer peripheral surface of the first plunger 11 is not in contact with an inner peripheral surface of the through hole 51 of the pin block 50. An air layer is interposed between the outer peripheral surface of the first plunger 11 and the inner peripheral surface of the through hole 51 of the pin block 50 to insulate the first plunger 11 and the pin block 50 from each other. Therefore, the first plunger 11 and the pin block 50 are not electrically connected with each other.

On the other hand, the inner dimension (inner diameter) of the through hole 52 of the pin block 50 is smaller than the inner dimension (inner diameter) of a narrowed part 42a of the pin plate 40 on the side of the pin block. 50 and the inner dimension (inner diameter) of the through hole 62 of the solder resist film 60. Thus, the first plunger 21 of the first ground probe 20 is in contact with and is supported by the inner peripheral surface of the through hole 52 of the pin block 50. The first plunger 21 and the pin block 50 are electrically connected with each other.

According to the present embodiment, the following effects can be obtained.

(1) The pin block 50 facing the device to be inspected with the solder resist film 60 sandwiched therebetween is made of a metal that is electrically connected to the measuring instrument-side ground by the conduction part having low inductance, and the first ground probe 20 that is electrically connected to the pin block 50 is brought into contact with the ground on the side of the device to be inspected. The pin block 50 substantially functions as a measuring instrument-side ground, and thus, it is possible to reduce the distance between the measuring instrument-side ground and the ground on the side of the device to be inspected, to reduce the inductance value (the inductance value between both ends of the first ground probe 20) between the measuring instrument-side ground and the ground on the side of the device to be inspected, and to improve the transmission characteristics of a signal transmitted by the signal probe 10. This makes it possible to suitably cope with a case where a large-diameter probe having a low inductance value cannot be used as the first ground probe 20 due to a demand for a narrow pitch between the signal probe 10 and the first ground probe 20, and the like.

(2) The air layer between the signal probe 10 and the pin block 50 provides sufficient insulation between the signal probe 10 and the pin block 50, and thus, it is not necessary to separately use an insulator ring or an insulating tube. The number of components can be reduced, which is advantageous in terms of assemblability and cost.

(3) Receiving a preload load of the signal probe 10 and the first ground probe 20 (load caused when the tip ends of the second plunger 12 and the second plunger 22 are pressed against an electrode of the inspection substrate and the springs in the conductive tube 13 and the conductive tube 23 are compressed), the pin plate 40 warps toward the side of the device to be inspected. The pin block 50 that is made of metal receives this warpage, and thus, compared to a case where the pin block 50 is made of resin, the warpage due to the preload load can be suppressed, even if the pin block 50 is thin. For this reason, the entirety of the pin plate 40, the pin block 50, and the solder resist film 60 constituting the support body can be reduced in thickness (reduced in height), and the signal probe 10 and the first ground probe 20 can be shortened to improve the signal transmission characteristics.

(4) The pin block 50 that is made of metal suppresses the warpage of the probe head 1 due to the preload load, and thus, the solder resist film 60 does not need to play a role in suppressing the warpage against the preload load, and can have a minimum thickness required for insulation between the device to be inspected and the pin block 50. Therefore, in addition to an advantage of reducing the thickness of the support body, it is possible to reduce the distance between the pin block 50 that functions as the measuring instrument-side ground and the device to be inspected, to reduce the inductance value between the measuring instrument-side ground and the ground on the side of the device to be inspected, and to improve the transmission characteristics of the signal transmitted by the signal probe 10.

Second Embodiment

Figure 2:
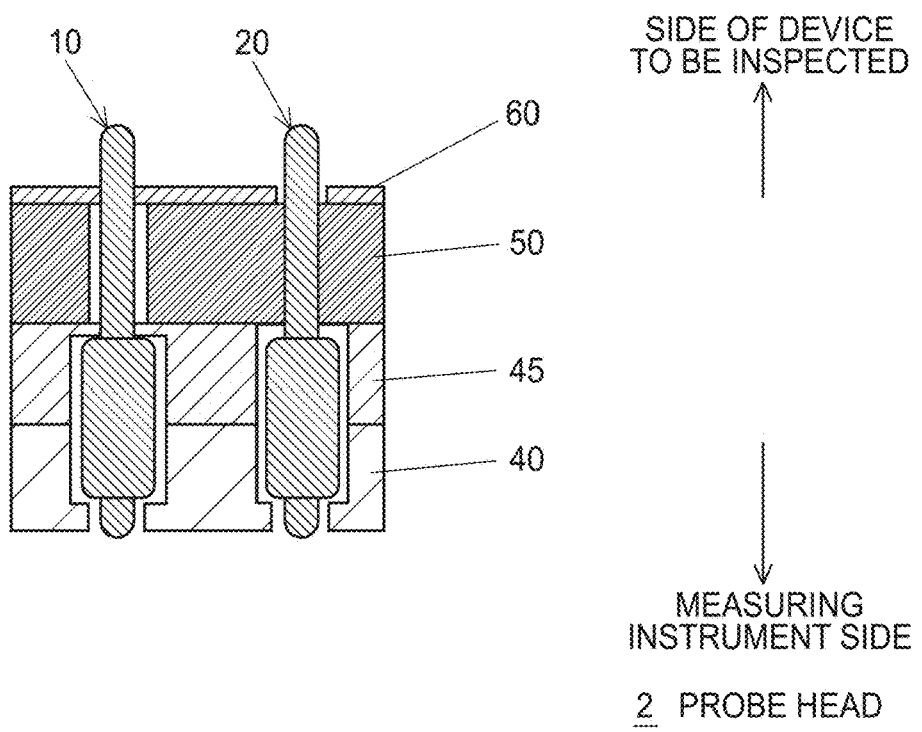
FIG. 2 is a schematic cross-sectional view of a probe head 2 according to a second embodiment of the present invention.

FIG. 2 is a schematic cross-sectional view of a probe head 2 according to a second embodiment of the present invention. The probe head 2 differs from the probe head 1 of the first embodiment in that an intermediate layer 45 is provided between the pin plate 40 and the pin block 50. The intermediate layer 45 is an insulator (insulating layer), such as a resin. The pin plate 40 and the intermediate layer 45 of the present embodiment correspond to the measuring instrument-side portion and the pin block 50 side portion of the pin plate 40 of the first embodiment, respectively. Other points of the present embodiment are similar to the first embodiment. The present embodiment can also provide a similar effect, to the first embodiment.

Figure 3:
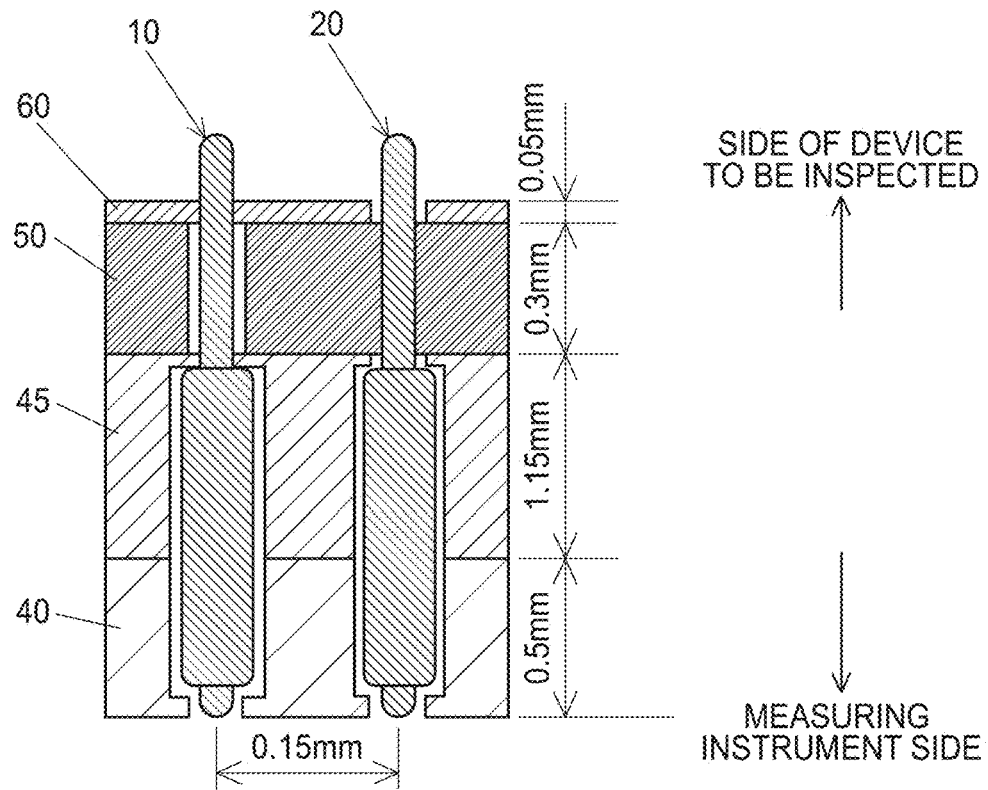
FIG. 3 is a schematic cross-sectional view of a probe head according to an example in which the inductance value between both ends of a first ground probe 20 is 0.059 nH in the configuration of the second embodiment.

FIG. 3 is a schematic cross-sectional view of a probe head according to an example in which the inductance value between both ends of the first ground probe 20 is 0.059 nH in the configuration of the second embodiment. As illustrated in FIG. 3, the thickness of the pin plate 40 was 0.5 mm, the thickness of the intermediate layer 45 was 1.15 mm, the thickness of the pin block. 50 was 0.3 mm, the thickness of the solder resist film 60 was 0.05 mm, and an arrangement pitch between the signal probe 10 and the first ground probe 20 was 0.15 mm. The signal probe 10 and the first ground probe 20 were made of beryllium copper. The pin plate 40 was made of machinable ceramic. The intermediate layer 45 was made of polyester. The pin block 50 was made of brass with a gold-plated surface. As a result, the inductance value between both ends of the first ground probe 20 could be reduced to 0.059 nH.

Figure 4:
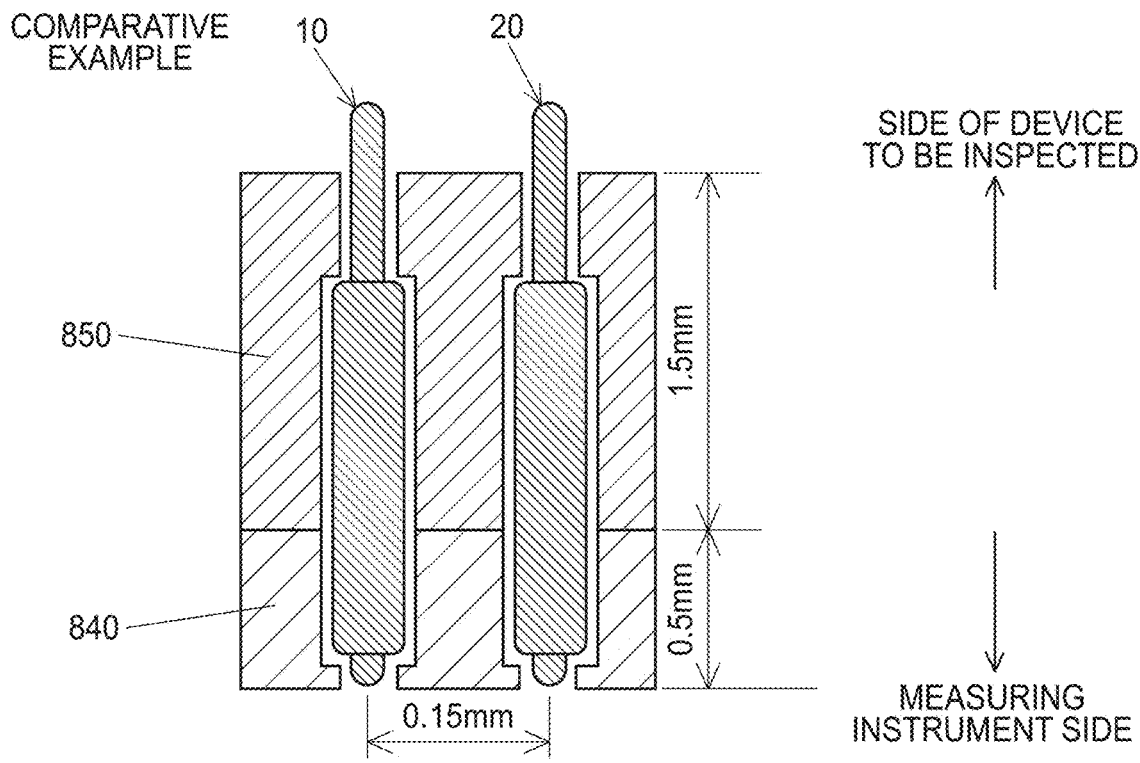
FIG. 4 is a schematic cross-sectional view of a probe head according to a comparative example in which the inductance value between both ends of the first ground probe 20 is 0.54 nH.

FIG. 4 is a schematic cross-sectional view of a probe head according to a comparative example in which the inductance value between both ends of the first ground probe 20 is 0.54 nH. In the comparative example, the support body that supports the signal probe 10 and the first ground probe 20 has a two-layered structure including a pin plate 840 and a pin block 850. As illustrated in FIG. 4, the thickness of the pin plate 840 was 0.5 mm, and the thickness of the pin block 850 was 1.5 mm. The pin plate 840 was made of machinable ceramic, and the pin block 850 was made of polyester. Other conditions were the same as those in FIG. 3. In the comparative example, the pin block 850 was made of a resin, and thus, the inductance value between both ends of the first ground probe 20 was as high as 0.54 nH. As described above, if the pin block 50 is made of metal as in the example of FIG. 3, an effect of reducing the inductance value is obtained.

Third Embodiment

Figure 5:
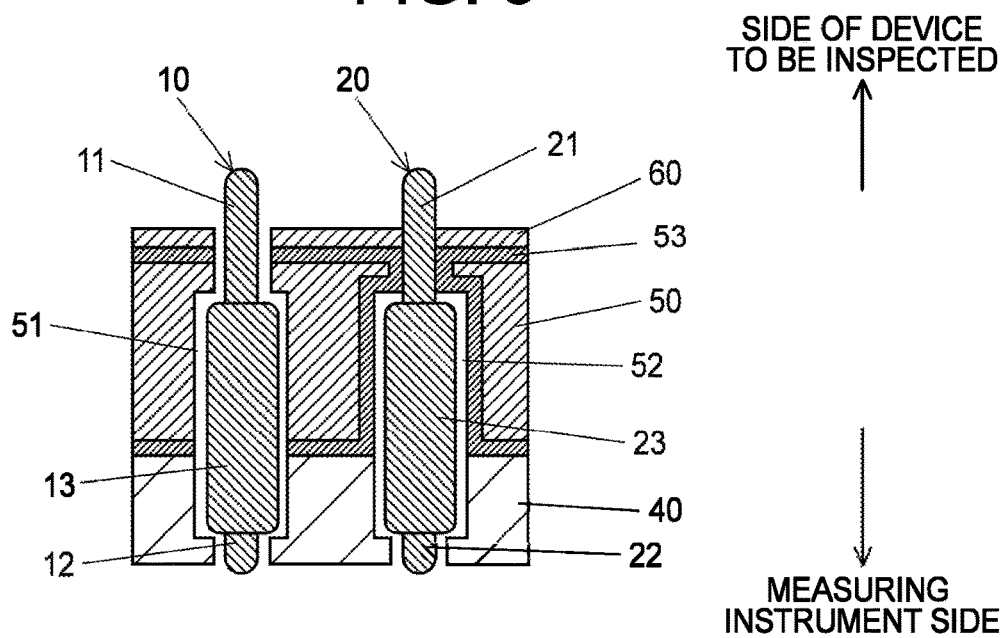
FIG. 5 is a schematic cross-sectional view of a probe head 3 according to a third embodiment of the present invention.

FIG. 5 is a schematic cross-sectional view of a probe head 3 according to a third embodiment of the present invention. The probe head 3 is different from the probe head 1 of the first embodiment in that the pin block 50 is an insulator (for example, ceramic) with a metal-coated surface 53. However, of the surface of the pin block 50, an inner surface of the through hole 51 accommodating the first plunger 11 and the conductive tube 13 of the signal probe 10 is not metal-coated, so that insulation between the signal probe 10 and the pin block 50 is ensured. Other points of the present embodiment are similar to the first embodiment. The first embodiment is superior from the viewpoint of suppressing the warpage of the pin block 50 due to the preload load, however, in other respects, the present embodiment can also provide an effect similar to the first embodiment.

Fourth Embodiment

Figure 6:
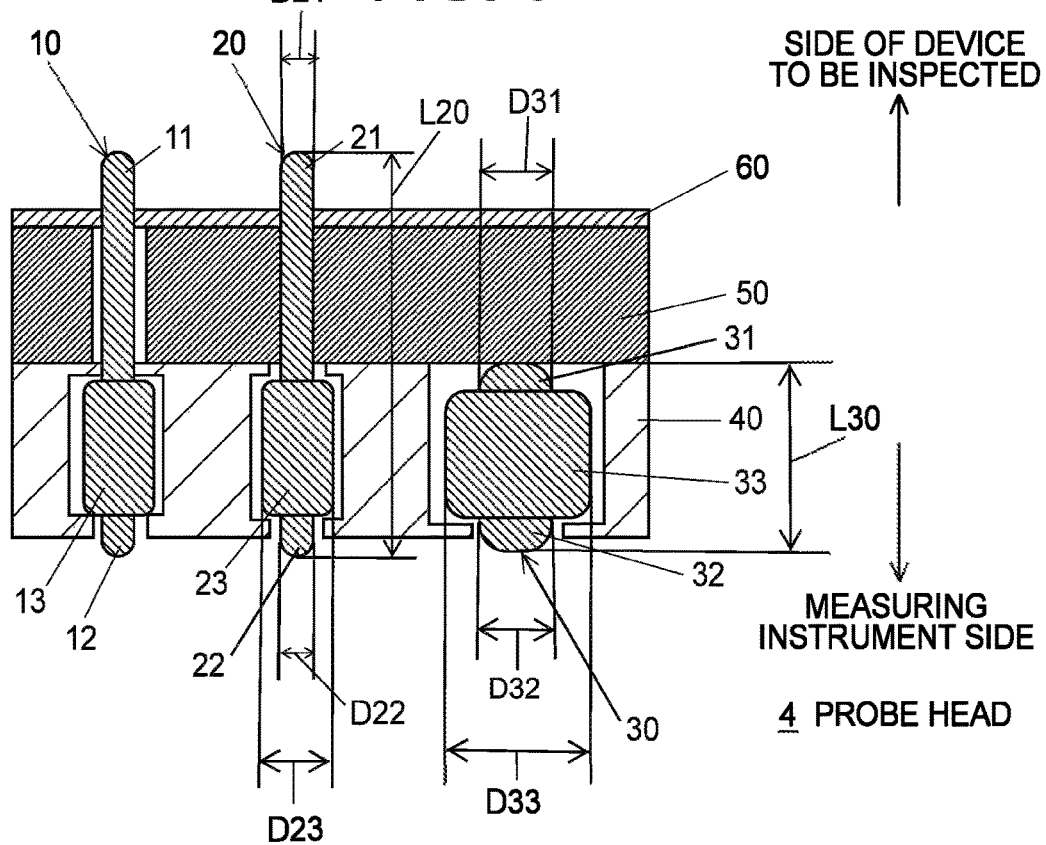
FIG. 6 is a schematic cross-sectional view of a probe head 4 according to a fourth embodiment of the present invention.

FIG. 6 is a schematic cross-sectional view of a probe head 4 according to a fourth embodiment of the present invention. The probe head 4 includes a second ground probe 30 in addition to the configuration of the probe head 1 of the first embodiment. The second ground probe 30 corresponds to an example of the conduction part (conduction part that electrically connects the pin block 50 to the measuring instrument-side ground) in the first embodiment (not illustrated). Similarly to the signal probe 10 and the first ground probe 20, a configuration of a known probe (for example, a spring probe) made of a metal such as copper or a copper alloy can be applied to the second ground probe 30. The second ground probe 30 includes a first plunger 31, a second plunger 32, and a conductive tube 33. The diameter D31 of the first plunger 31 is larger than the diameter D21 of the first plunger 21 of the first ground probe 20. The diameter D32 of the second plunger 32 is larger than the diameter D22 of the second plunger 22 of the first ground probe 20. The diameter D33 of the conductive tube 33 is larger than the diameter D23 of the conductive tube 23 of the first ground probe 20. The length L30 of the second ground probe 30 is shorter than the length L20 of the first ground probe 20. The second ground probe 30 does not penetrate the pin block 50 and is in contact with the surface of the pin block 50 on the measuring instrument side to be electrically connected to the pin block 50. Other points of the present embodiment are similar to the first embodiment. According to the present embodiment, the second ground probe 30 having a large diameter and a short length electrically connects the pin block 50 to the measuring instrument-side ground at a position close to the first ground probe 20, and thus, the effect of reducing the inductance value of the first ground probe 20 is further increased The present invention was described above by using the embodiments as examples. However, it will be understood by those skilled in the art that various modifications can be made to each constituent component and each processing process of the embodiments within the scope described in the claims. A modified example will be described below.

The insulation layer is not limited to an insulator that is a sheet or film fixed to the surface of the pin block 50 on the side of the device to be inspected, but may be an insulating material applied and fixed to the surface of the pin block 50 on the side of the device to be inspected. Each probe is not limited to the configuration exemplified in the embodiments, and various types of spring probes can be used.

DESCRIPTION OF REFERENCE NUMERALS

1 to 4 Probe head, 10 Signal probe, 11 First plunger, 12 Second plunger, 13 Conductive tube, 20 First ground probe, 21 First plunger, 22 Second plunger, 23 Conductive tube, 30 Second ground probe, 31 First plunger, 32 Second plunger, 33 Conductive tube, 40 Pin plate, 41 Through hole, 41a Narrowed part, 42 Through hole, 42a Narrowed part, 50 Pin block, 51 Through hole, 52 Through hole, 60 Solder resist film (insulation layer), 61 Through hole, 62 Through hole

The invention claimed is:

1. A probe head, comprising:
a signal probe;
a first ground probe; and
a pin block through which the signal probe and the first ground probe penetrate, wherein at least a part of the pin block is electrically conductive, and the pin block is electrically connected to the first ground probe and is not electrically connected to the signal probe, and an insulation layer through which the signal probe and the first ground probe penetrate is provided on a surface of the pin block on a side of a device to be inspected, the insulation layer supporting the signal probe while not supporting the first ground probe,
wherein the pin block includes a first through hole into which the signal probe is inserted, and a second through hole into which the first ground probe is inserted,
wherein an inner diameter of the first through hole is larger than the inner diameter of a through hole of the insulation layer into which the signal probe is inserted, and
wherein the inner diameter of the second through hole is smaller than the inner diameter of a through hole of the insulation layer into which the first ground probe is inserted.

2. The probe head according to claim 1, wherein the insulation layer includes a sheet or a film.

3. The probe head according to claim 1, wherein the insulation layer includes an insulating material applied to the surface of the pin block.

4. The probe head according to claim 1, wherein the insulation layer is fixed to the pin block.

5. The probe head according to claim 1, wherein the pin block is made of metal.

6. The probe head according to claim 1, wherein the pin block includes an insulator with a metal-coated surface.

7. The probe head according to claim 1, the probe head further comprising a second ground probe that electrically connects the pin block to a measuring instrument-side ground.

8. The probe head according to claim 7, wherein a length of the second ground probe is shorter than a length of the first ground probe, a diameter of the second ground probe is larger than a diameter of the first ground probe, and the second ground probe is in contact with a surface of the pin block on a measuring instrument side to be electrically connected to the pin block.

9. The probe head according to claim 1, further comprising an insulation support body, wherein the insulation support body is closer to the measuring instrument-side.

10. The probe head according to claim 1, further comprising an insulation support body, wherein the insulation support member is longer than the pin block in a direction in which the signal probe and the first ground probe penetrate.

11. A probe head, comprising:
a signal probe,
a first ground probe; and
a pin block through which the signal probe and the first ground probe penetrate, wherein at least a part of the pin block is electrically conductive, and the pin block is electrically connected to the first ground probe and is not electrically connected to the signal probe, and an insulation layer through which the signal probe and the first ground probe penetrate is provided on a surface of the pin block on a side of a device to be inspected, the insulation layer supporting the signal probe while not supporting the first ground probe,
wherein an inductance value between the pin block and a measuring instrument-side ground is lower than an inductance value of a portion of the first ground probe from a tip end thereof on the measuring instrument-side ground to a contact part between the first ground probe and the pin block.

12. The probe head according to claim 11, wherein the insulation layer includes a sheet or a film.

13. The probe head according to claim 11, wherein the insulation layer includes an insulating material applied to the surface of the pin block.

14. The probe head according to claim 11, further comprising an insulation support body, wherein the insulation support body is closer to the measuring instrument-side.

15. The probe head according to claim 11, further comprising an insulation support body, wherein the insulation support body is longer than the pin block in a direction in which the signal probe and the first ground probe penetrate.

16. A probe head, comprising:
a signal probe;
a first ground probe; and
a pin block through which the signal probe and the first ground probe penetrate, wherein at least a part of the pin block is electrically conductive and is electrically connected to ground of a measuring instrument side, and the pin block is electrically connected to the first ground probe and is not electrically connected to the signal probe, and an insulation layer through which the signal probe and the first ground probe penetrate is provided on a surface of the pin block on a side of a device to be inspected,
wherein the pin block includes a first through hole into which the signal probe is inserted, and a second through hole into which the first ground probe is inserted,
wherein an inner diameter of the first through hole is larger than the inner diameter of a through hole of the insulation layer into which the signal probe is inserted, and
wherein the inner diameter of the second through hole is smaller than the inner diameter of a through hole of the insulation layer into which the first ground probe is inserted.

17. The probe head according to claim 16, further comprising an insulation support body, wherein the insulation support body is closer to the measuring instrument-side.

18. The probe head according to claim 16, further comprising an insulation support body, wherein the insulation support member is longer than the pin block in a direction in which the signal probe and the first ground probe penetrate.

19. A probe head, comprising:
a signal probe;
a first ground probe; and
a pin block through which the signal probe and the first ground probe penetrate, wherein at least a part of the pin block is electrically conductive and is electrically connected to ground of a measuring instrument side, and the pin block is electrically connected to the first ground probe and is not electrically connected to the signal probe, and an insulation layer through which the signal probe and the first ground probe penetrate is provided on a surface of the pin block on a side of a device to be inspected, wherein an inductance value between the pin block and a measuring instrument-side ground is lower than an inductance value of a portion of the first ground probe from a tip end thereof on the measuring instrument-side ground to a contact part between the first ground probe and the pin block.

20. The probe head according to claim 19, further comprising an insulation support body, wherein the insulation support body is closer to the measuring instrument-side.

* * * * *